(12) United States Patent
Pu et al.

(10) Patent No.: US 10,716,184 B1
(45) Date of Patent: Jul. 14, 2020

(54) LED TUBE

(71) Applicant: CH LIGHTING TECHNOLOGY CO., LTD., Shaoxing, Zhejiang Province (CN)

(72) Inventors: Jizhong Pu, Shaoxing (CN); Caiying Gan, Shaoxing (CN); Shengjun Cao, Shaoxing (CN)

(73) Assignee: CH LIGHTING TECHNOLOGY CO., LTD., Shaoxing (CN)

( * ) Notice: Subject to any disclaimer, the term of this patent is extended or adjusted under 35 U.S.C. 154(b) by 0 days.

(21) Appl. No.: 16/436,806

(22) Filed: Jun. 10, 2019

(30) Foreign Application Priority Data

Apr. 22, 2019 (CN) .......................... 2019 1 0325035

(51) Int. Cl.
*H05B 33/08* (2020.01)
*H05B 45/37* (2020.01)
*H03K 5/24* (2006.01)
*H05B 45/10* (2020.01)
*H05B 45/50* (2020.01)

(52) U.S. Cl.
CPC .............. *H05B 45/37* (2020.01); *H03K 5/24* (2013.01); *H05B 45/10* (2020.01); *H05B 45/50* (2020.01)

(58) Field of Classification Search
CPC ........... H05B 33/0809; H05B 33/0815; H05B 33/0845; H05B 33/0851
USPC ................................ 315/186, 193, 297, 307
See application file for complete search history.

(56) References Cited

U.S. PATENT DOCUMENTS

| | | | | |
|---|---|---|---|---|
| 2012/0038292 A1* | 2/2012 | Kuo | ........................ | H05B 45/37 315/297 |
| 2012/0112650 A1* | 5/2012 | Kuo | .................... | H05B 33/0818 315/200 R |
| 2013/0147379 A1* | 6/2013 | Zhou | ....................... | H05B 45/37 315/210 |
| 2014/0354166 A1* | 12/2014 | Yu | ....................... | H05B 33/0818 315/201 |
| 2015/0097489 A1* | 4/2015 | Wu | ......................... | H05B 45/46 315/122 |
| 2016/0044757 A1* | 2/2016 | Koo | ...................... | H05B 33/089 315/297 |

* cited by examiner

*Primary Examiner* — Tung X Le
(74) *Attorney, Agent, or Firm* — Jiwen Chen

(57) ABSTRACT

The present invention discloses an LED lamp tube, comprising a driving circuit controlled by a switch when used, the driving circuit comprises: a dimming controller having a switch state monitoring port and a power supply port, and the power supply voltage is gradually formed after the switch is disconnected. When the switch is turned on again, if the supply voltage is between the first set value and the second set value, the output of the drive signal is the same as the signal when the switch is turned off, so that the current flowing through the LED light source remains unchanged. If the supply voltage is lower than the second set value, it outputs a dynamically changing driving signal, so that the current flowing through the LED light source gradually changes from the first extreme value to the second extreme value; and the power conversion unit is configured to receive the drive signal and provide energy to the LED light source. The LED lamp of the present invention can achieve dimming function by only operating the power switch, and does not need to modify the original circuit, and is easy to implement.

10 Claims, 4 Drawing Sheets

US 10,716,184 B1

LED TUBE

This application claims the priority benefit of Chinese Application No. 201910325035. 5, filed Apr. 22, 2019, which is hereby incorporated by reference.

TECHNICAL FIELD

The present invention relates to the technical field of LED (light-emitting diode) illumination, in particular to a dimmable LED lamp tube.

BACKGROUND TECHNOLOGY

LED lamp tubes have the advantages of environmental protection and high efficiency, and have gradually replaced traditional fluorescent tubes. The general LED tube does not have the dimming or lightness adjustable function, which affects the use experience. To solve this problem, for example, CN108633142A discloses a dimming circuit for an LED lamp, including a constant voltage source, and an LED load connected in series to the output of the constant voltage source. The switch tube at the end, the driving circuit electrically connected to the switch tube, and the driving circuit drives the switch tube to be turned on and off under normal conditions to perform PWM lightness adjustment on the LED load.

For example, CN208445794U discloses a dimmable LED lamp driving circuit, which comprises a DC/DC conversion circuit, an LED lamp string and a switch tube driving circuit, and the DC/DC conversion circuit is connected to the LED lamp string through the switch tube Q1, the switch tube Q1 is connected to the switch tube driving circuit; the circuit is combined with a frequency modulation chip and a switch tube driving circuit to adjust the frequency of the switch tube, thereby adjusting the brightness of the LED string.

Another example is CN105554956A, which discloses a PWM lamp illumination system based on dimmable PWM, including a rectifier circuit, an output driving circuit, a PWM dimmable circuit and an LED illumination source. The rectifier circuit converts the alternating current into direct current, and sends it to the output driving circuit, which will be outputted through the output driving circuit. The output voltage obtained by the action is loaded on the dimmable control chip of the PWM dimmable circuit to provide power supply for the chip, and the dimmable control chip determines the on/off of the internal power switch according to the PWM signal provided by the port, and changes output current of the LED light source.

The above LED tubes regulate the current flowing through the LED source by changing the duty cycle of the PWM signal, but most of the LED tube control devices only have a power switch. Thus, it is important to find out how to dim the LED tube through the power switch.

SUMMARY OF THE INVENTION

The present invention provides an LED lamp that is dimmable only by operating a power switch.

An LED lamp comprising a driving circuit controlled by a switch when in use, the driving circuit comprising:

a dimming controller having a switch state monitoring port and a power supply port, wherein power supply voltage of the dimming controller gradually decreases after the switch is turned off, and when the switch is turned on again, if the power supply voltage is between a first set value and a second set value, the dimming controller outputs same driving signal as the signal when the switch is off, so that the current flowing through the LED light source remains unchanged. If the supply voltage is lower than the second set value, the dimming controller outputs a dynamically changing driving signal to cause current flowing through the LED light source gradually changes from a first extreme value to a second extreme value; and a power conversion unit, configured to receive the driving signal and provide energy for the LED light source.

If the supply voltage is lower than the second set value, the dimming controller outputs a dynamic drive signal to gradually change the current flowing through the LED light source from a minimum value to a maximum value.

The dimming controller comprises:

a dimming trigger module outputting a corresponding trigger signal according to the switch state;

an undervoltage detection module for detecting a supply voltage of the input dimming controller;

a reference signal generator outputting a reference signal having a fixed potential or a gradient change according to the magnitude of the power supply voltage at the on-time of the switch;

a PWM pulse width modulation module being configured to receive the reference signal and synthesize the PWM pulse signal.

The PWM pulse width modulation module comprises:

a transconductance amplifier having a reference signal input end and a sampling signal input end for comparing the reference signal and the sampling signal, and outputting the comparison result;

a sawtooth generator for generating a sawtooth signal;

a comparator synthesizing the PWM pulse signal using the sawtooth signal and the comparison result.

The power conversion unit comprises: a first switch tube connected in series with the LED light source, an autotransformer; and a freewheeling diode connected in parallel with the autotransformer. A negative pole of the freewheeling diode is connected to the source of the first switch tube, and a positive pole of the freewheeling diode is connected to the LED light source.

The driving circuit comprises a rectifying unit, an input filtering unit, and an output filtering unit, wherein the power conversion unit is disposed between the input filtering unit and the output filtering unit.

A safety protection unit is disposed between the rectifying unit and the input filtering unit.

The security protection unit comprises:

a second switch tube;

a voltage acquisition port for collecting current input to the grid;

a current collecting port for collecting a voltage applied to an input terminal of the power grid;

an impedance calculator that calculates the grid impedance using the voltage and current;

an impedance comparator compares the grid impedance with the set value to control the second switch to be turned on or off.

The driving circuit comprises a strobe eliminating unit in series with the LED light source.

The time when the supply voltage drops from the first set value to the second set value is 3-5 seconds, and the time that the current flowing through the LED light source gradually changes from the first extreme value to the second extreme value is 5-10 seconds.

The LED lamp of the present invention can adjust lightness or be dimmed only by operating the power switch, and

DETAILED EMBODIMENTS OF THE INVENTION

Figure 1:
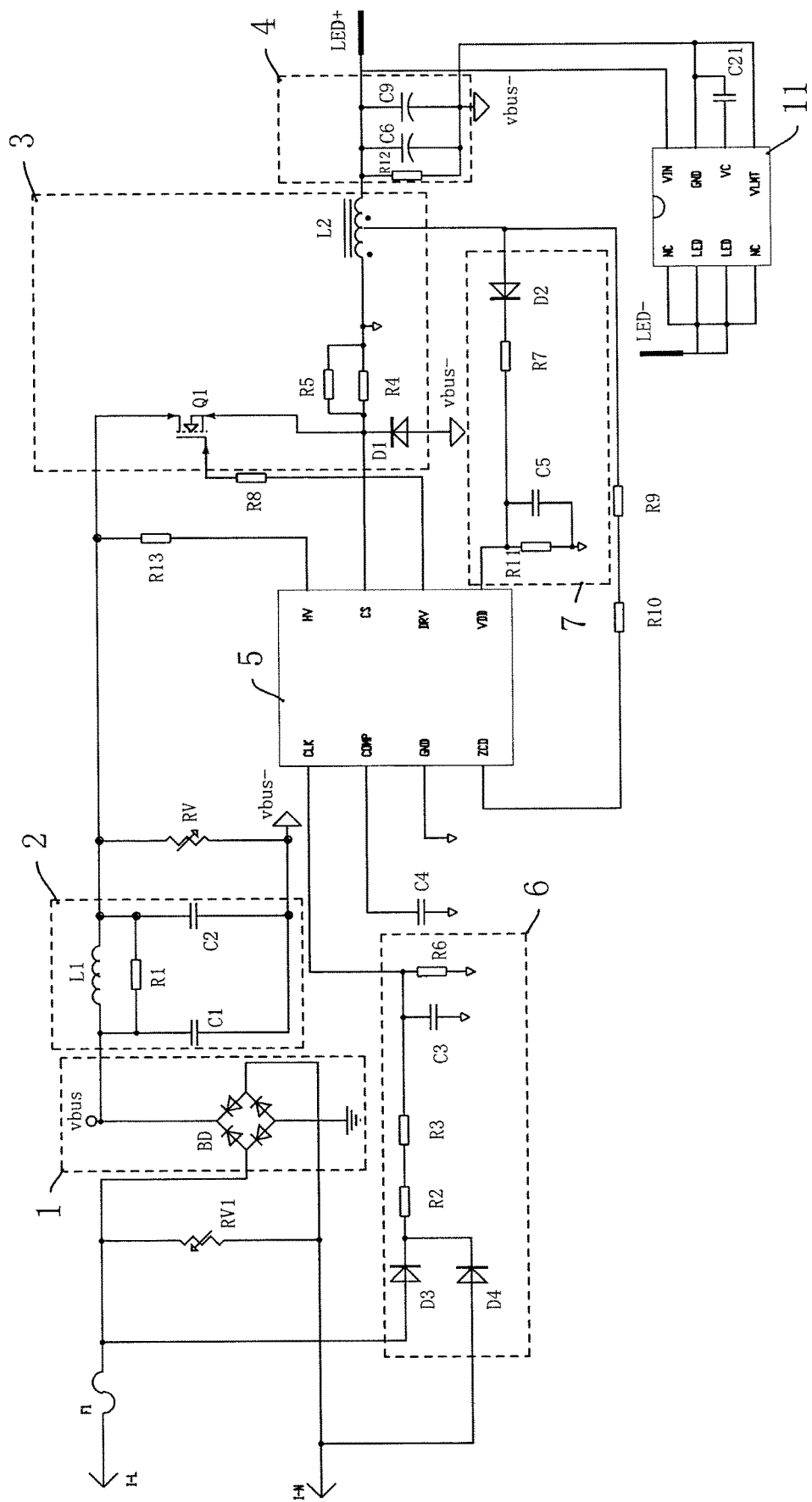
FIG. 1 is a schematic diagram of an LED lamp driving circuit of the present invention.

As shown in FIG. 1, a driving circuit of an LED lamp tube comprises a rectifying unit 1, an input filtering unit 2, a power conversion unit 3, and an output filtering unit 4 connected in sequence, wherein the rectifying unit 1 is composed of four diodes. A rectifier BD is used to convert the input alternating current into direct current. The input filtering unit 2 is configured to smooth the direct current to make the input current relatively stable. In one embodiment, the input filtering unit 2 includes a capacitor C1 and a capacitor C2 connected in parallel, and parallel connected inductor L1 and resistor R1 are disposed between the capacitor C1 and the capacitor C2.

In order to protect the internal circuit safety, a varistor RV1 and a varistor RV are respectively disposed before the rectifying unit 1 and after the input filtering unit 2.

The power conversion unit 3 receives the driving signal of the dimming controller 5 to provide energy for the LED light source. It is composed of a switching transistor Q1, an autotransformer L2 and a freewheeling diode D1, and a source of the switching transistor Q1 is connected to the autotransformer L2 and freewheeling diode D1, a drain of the switching transistor Q1 is connected to the input filter unit 2, and a gate of the switching transistor Q1 receives a drive signal of the dimming controller 5.

When the switch Q1 is turned on, the current flowing through the LED light source gradually becomes larger due to the current limiting action of the autotransformer L2, and when the switch tube Q2 is turned off, the current flow through the autotransformer L2 also flows through the LED light source gradually reduces to achieve a steady flow effect.

In order to achieve the purpose of current limiting, the autotransformer L2 and the switching transistor Q1 and the freewheeling diode D1 have a resistor R4 and a resistor R5 arranged and connected in parallel.

The output filtering unit 4 is also used to eliminate fluctuations in current, such as noise. It comprises a capacitor C6, a capacitor C9 and a resistor R12 arranged in parallel, wherein the resistor R12 is used for capacitor discharge.

The dimming controller 5 has eight pins, wherein the pin VDD is a power supply port, which is connected to an external buck (step-down) power supply circuit 7, and the buck power supply circuit 7 includes a current limiting diode D2, a resistor R7, a resistor R11 that are serially connected. The capacitor C5 connected in parallel with the resistor R11, the resistor R11 and the capacitor C5 are grounded, and the junction between the resistor R7 and the resistor R11 is connected to the pin VDD. The input terminal of the step-down power supply circuit 7 is connected to the intermediate pin of the autotransformer L2. When the switch 12 is turned off, the capacitor C5 is discharged to the resistor R11, and the voltage across the terminals continues to drop, and the dimming controller 5 continues to supply power for a period of time.

The pin CLK is a switch monitoring port, which is connected to the peripheral switch monitoring circuit 6. The switch monitoring circuit 6 includes a resistor R2, a resistor R3, a resistor R6 that are serially connected; and a capacitor C3 that is parallelly connected with the resistor R6. A resistor R6 and a capacitor C3 are grounded. The connection node of the resistor R3 and the resistor R6 is connected to the pin CLK.

The pin DRV is a gate drive port, and is connected to the gate of the switch Q1 through a resistor R8. The pin HV is a high voltage start port which is connected to the output of the input filter unit 2 via a resistor R13. Pin COMP is the compensation port and is grounded through the capacitor C4. The pin ZCD is a zero-crossing detection and overvoltage protection port, which is connected to the middle leg of the autotransformer L2 through a series connected resistor R9 and a resistor R10. The pin CS is a current sampling port and is directly connected to the source of the switch Q1.

Figure 4:
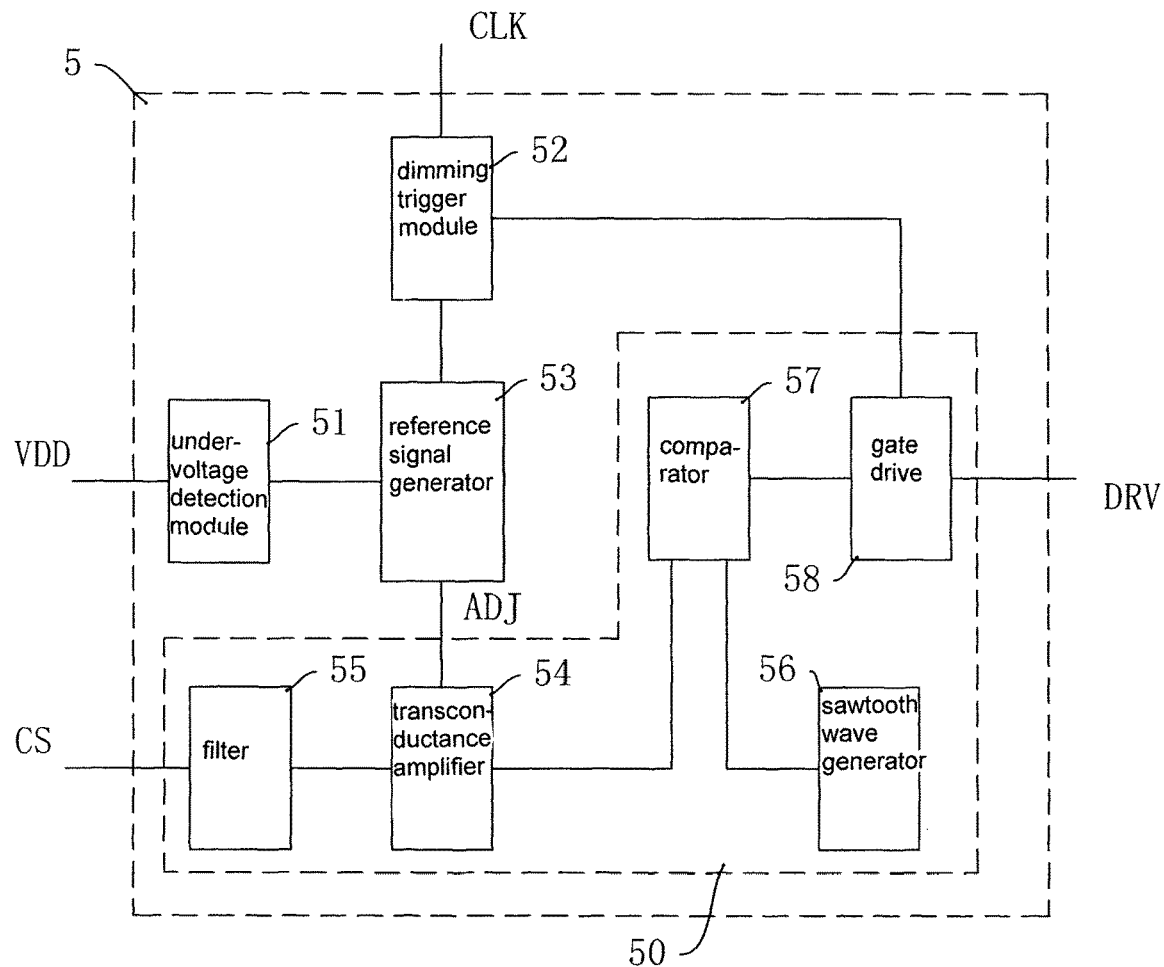
FIG. 4 is a schematic diagram of a module structure of a dimming controller.
Figure 5:
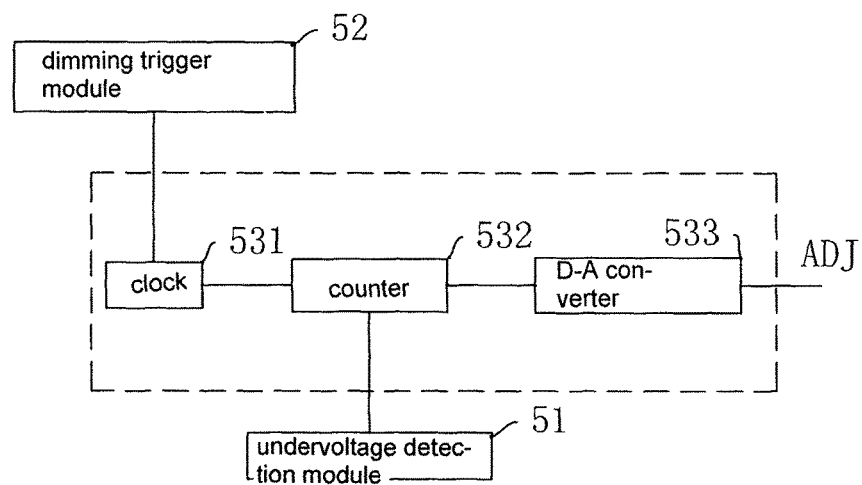
FIG. 5 is a block diagram showing the structure of a reference signal generator.
Figure 6:
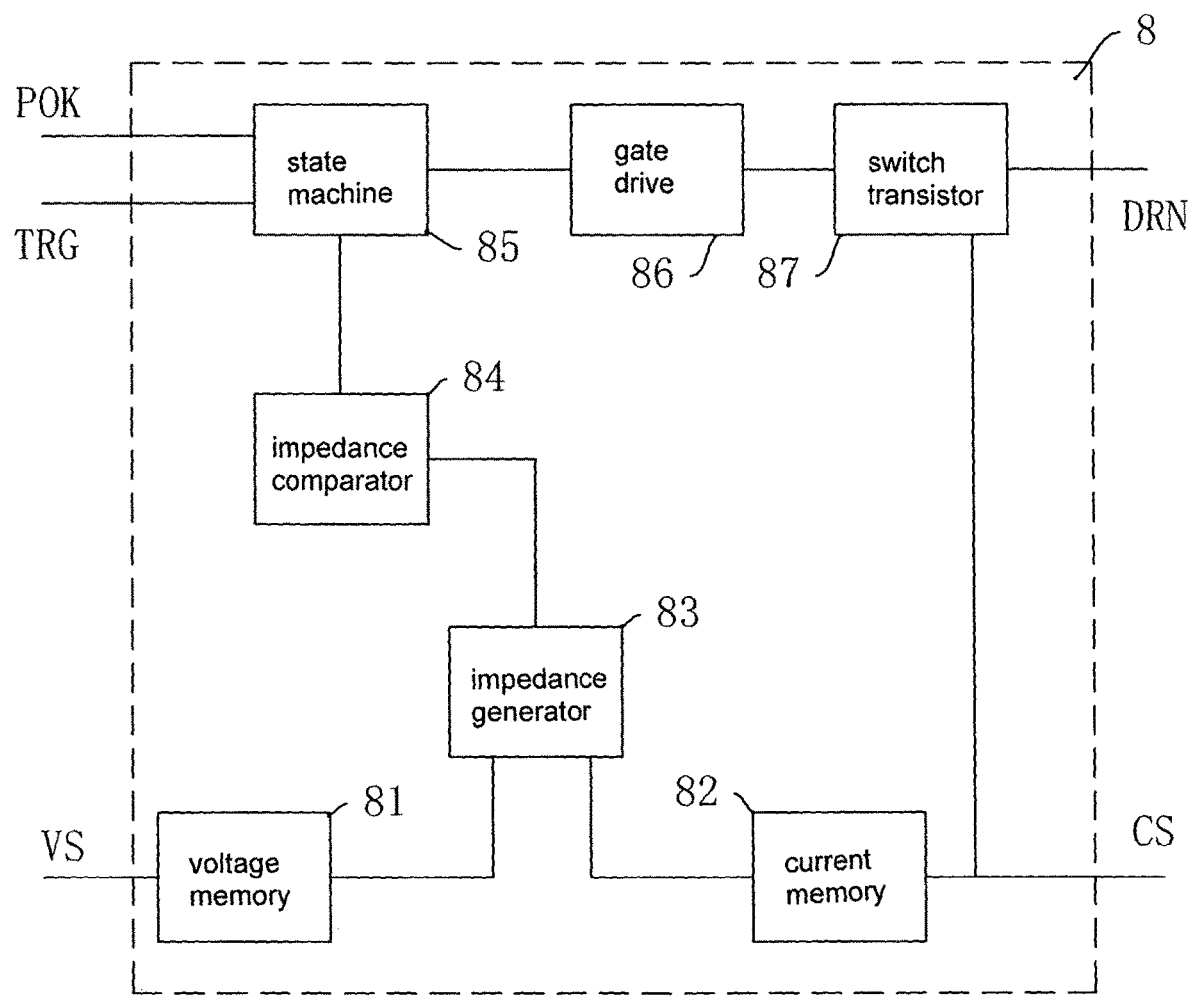
FIG. 6 is a block diagram showing the structure of the security protection unit.

Further explaining the operation principle of the dimming controller 5, as shown in FIGS. 4 and 5, the dimming controller 5 includes an undervoltage detecting module 51, a dimming trigger module 52, a reference signal generator 53, and a PWM pulse modulation module 50. The undervoltage detection module 51 is connected to an external buck power supply circuit 7 to detect the supply voltage of the dimming controller. The dimming trigger module 52 is connected to the external switch monitoring circuit 6, and outputs a dimming request signal or a dimming termination signal according to the state of the switch 12.

As shown in FIG. 5, the reference signal generator 53 includes a clock 531, a counter 532, and a digital-to-analog converter 533. The clock 531 is controlled by the dimming trigger module 52, and starts to work after receiving the trigger request signal, and stops to work after receiving the trigger termination signal.

The counter 532 receives a jump (e.g., from 0 to 1) after receiving the output signal of the clock 531, and drives the digital-to-analog converter 533 to change the potential of the reference signal of its output. However, when the counter 532 is in the locked state, no jump occurs even if the clock signal is received. Whether or not the counter 521 is locked depends on the magnitude of the power supply voltage of the dimming controller 5 or whether it has jumped to the maximum value.

After the switch 12 is turned off, the power supply voltage continues to decrease. When the value is between the first set value and the second set value, the undervoltage detecting module 51 sends a signal to lock the counter 532. If the switch 12 has not been turned on, when the supply voltage drops below the second set value, the counter 532 is reset (i.e., jumps to 0), that is, no longer locked. If the supply voltage is greater than the first set value, the undervoltage detection module 51 drives the counter 532 to count normally.

In this embodiment, the first set value is 15V, the second set value is 4V, and the voltage across the capacitor C5 is reduced from 15V to 4V, which takes about 4 seconds, and the switch 12 is turned on again within the 4 seconds. The reference signal generator 53 can output a reference signal of a fixed potential, and since the counter 532 does not jump, the potential of the reference signal is the same as the potential of the reference signal when the switch is turned off. In this embodiment, it takes about 7 seconds for the counter 532 to jump from the minimum value to the maximum value, that is, the LED tube is dimmed in 7 seconds.

The current flowing through the LED light source is sampled and input to the dimming controller 5, and the current is filtered by the filter 55 and compared with the reference signal in the transconductance amplifier 54 to obtain an operation result and a sawtooth wave generated by the sawtooth wave generator 56. The input comparator 57 synthesizes a PWM pulse signal. The PWM pulse signal and the dimming request signal are turned on or off by the AND control switch Q1. A change in the potential of the reference signal changes the duty cycle of the PWM pulse signal, thereby adjusting the amount of current flowing through the LED source.

Therefore, when the switch 12 is normally turned on, the reference signal generator outputs a reference signal whose potential changes in a gradient, thereby gradually changing the duty ratio of the PWM pulse signal, and adjusting the magnitude of the current flowing through the LED light source. During the dimming process, the switch 12 is turned off, and the power supply voltage of the dimming controller 5 instantaneously drops below the first set value, the counter 532 is locked, and the value does not jump any more.

If the switch 12 is turned on again before the power supply voltage drops below the second set value, the dimming trigger module 52 issues the dimming request signal again, but the counter 532 is already locked, the value cannot be jumped, and the reference signal generator 53 can only outputs the reference signal with a constant potential, the duty ratio of the PWM pulse signal remains unchanged, and the current flowing through the LED light source does not change.

If the power supply voltage has dropped below the second set value, the counter 532 is reset, unlocked, and then the switch 12 is turned on, and the reference signal generator 53 outputs a reference signal, whose potential changes in a gradient, and the LED tube starts to automatically start again to adjust lightness. The dimming mode generally changes from a minimum brightness to a maximum brightness, and of course can be the opposite variation.

In order to avoid the operator touching the end of the lamp when the lamp is installed, the current input to the other end of the lamp tube is subjected to an electric shock accident. The driving circuit of the embodiment further includes a safety protection unit 8, and the safety protection unit 8 is provided with a current. The sampling circuit 9 and the voltage sampling circuit 10 are respectively connected to the pin CS and the pin VS of the safety protection unit, and the pin CS and the pin VS respectively serve as a current sampling port and a voltage sampling port of the safety protection unit 8.

Figure 2:
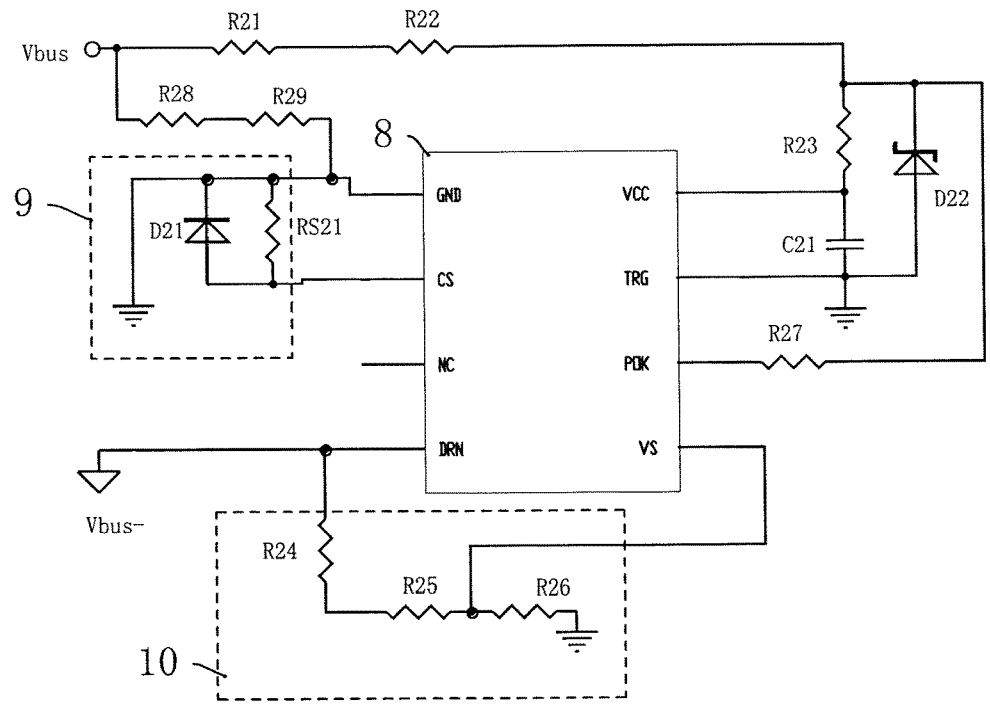
FIG. 2 is a schematic diagram of the connection between the security protection module and the peripheral circuit of the present invention.
Figure 3:
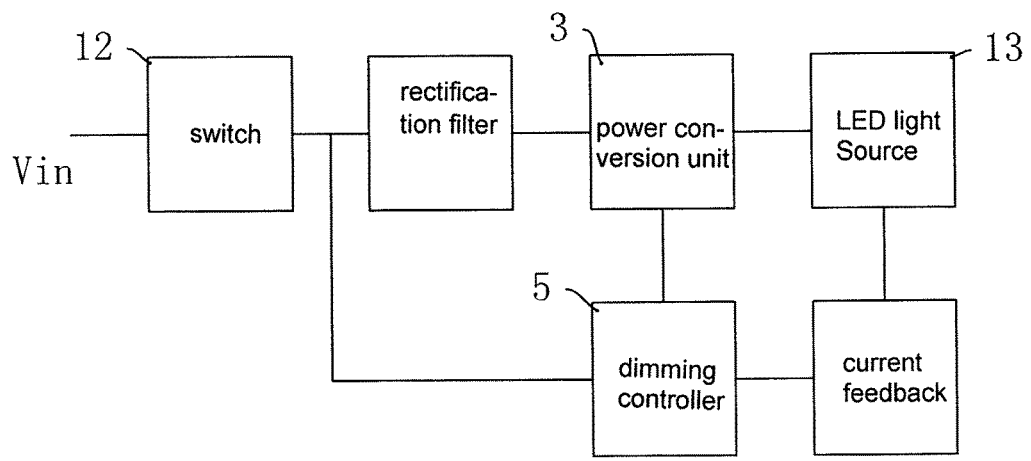
FIG. 3 is a schematic structural diagram of a module of a dimming portion of a driving circuit of the present invention.

As shown in FIG. 2, the current sampling circuit 9 includes a grounded resistor RS1 and a diode D21 connected in parallel with the resistor RS1 to collect current input to the grid. The voltage sampling circuit includes a resistor 24, a resistor 25 and a resistor 26. The pin VS connects the junction of the resistor 25 and the resistor 26 to collect the voltage applied to the input terminal of the grid.

As shown in FIG. 5, the security protection unit 8 includes a voltage memory 81, a current memory 82, an impedance generator 83, an impedance comparator 84, a state machine 85, a gate drive 86, and a switch transistor 87. The voltage memory 81 is used for storing the voltage collected by the sampled circuit. The current memory 82 is used to store the current collected by the sampling circuit.

The collected voltage and current are input to the impedance generator 83, and the current impedance of the power grid is obtained, and the impedance is compared with the set value. If it is greater than the set value (for example, 500 ohms), the switch 87 is turned off by the gate drive 86, so that the current does not flow through the LED light source 13. If it is less than the set value, the switch tube 87 is turned on by the gate drive 86, and the LED tube can work normally.

The pin VCC is a power supply port, and is connected to the resistor R21, the resistor R22 and the resistor R23 which are serially connected, and is grounded through the capacitor C21. The connection node between the resistor R21 and the resistor R22 is connected to the pin TRG through the Zener diode D22, and is connected to the pin POK through the resistor R27.

The present invention is further provided with a strobe eliminating unit 11, which eliminates the strobe unit GND of the strobe unit 11 (such as the DIO8241F chip) and the pin VC connected by the capacitor C21, so that the current ripple flowing through the LED source can be eliminated.

The invention claimed is:

1. An LED lamp comprising a driving circuit controlled by a switch during use, wherein the driving circuit comprises:
   a dimming controller having a switch state monitoring port and a power supply port, wherein the power supply voltage gradually decreases after the switch is turned off, and when the switch is turned on again, if the power supply voltage is between a first set value and a second set value, the dimming controller outputs a driving signal with the same value as the driving signal when the switch is off, so that the current flowing through the LED light source remains unchanged; when the supply voltage is lower than the second set value, the dimming controller outputs a dynamically changing driving signal to cause current flowing through the LED light source gradually changing from a first extreme value to a second extreme value; and
   a power conversion unit, configured to receive the driving signal and provide energy for the LED light source;
wherein the dimming controller comprises:
   a dimming trigger module outputting a corresponding trigger signal according to the switch state;
   an undervoltage detection module for detecting a supply voltage of the input dimming controller;
   a reference signal generator outputting a reference signal having a fixed potential or a gradient change according to magnitude of the power supply voltage at a time when the switch is on;
   a PWM pulse width modulation module that is configured to receive the reference signal and synthesize the PWM pulse signal.

2. The LED tube according to claim 1, wherein, when the supply voltage is lower than the second set value, the dimming controller outputs a dynamic driving signal to gradually change the current flowing through the LED source from a minimum value to a maximum value.

3. The LED lamp according to claim 1, wherein the PWM pulse width modulation module comprises:
   a transconductance amplifier having a reference signal input end and a sampling signal input end for comparing the reference signal and the sampling signal, and outputting the comparison result;

a sawtooth generator for generating a sawtooth signal; and a comparator synthesizing the PWM pulse signal using the sawtooth signal and the comparison result.

4. The LED lamp tube according to claim 3, wherein the power conversion unit comprises a first switch tube connected in series with the LED light source, an autotransformer and a freewheeling diode connected in parallel with the autotransformer; a negative pole of the freewheeling diode is connected to the source of the first switching transistor; and a positive electrode is connected to the LED light source.

5. The LED lamp tube according to claim 1, wherein the power conversion unit comprises a first switch tube connected in series with the LED light source, an autotransformer and a freewheeling diode connected in parallel with the autotransformer; a negative pole of the freewheeling diode is connected to the source of the first switching transistor; and a positive electrode is connected to the LED light source.

6. The LED lamp according to claim 1, wherein the driving circuit comprises a rectifying unit, an input filtering unit, and an output filtering unit, wherein the power conversion unit is disposed between the input filtering unit and the output filtering unit.

7. The LED tube according to claim 6, wherein a safety protection unit that controls the driving circuit to be turned on or off is disposed between the rectifying unit and the input filtering unit.

8. The LED tube according to claim 7, wherein the security protection unit comprises:

a second switch tube;

a voltage acquisition port for collecting current input to a power grid;

a current collecting port for collecting a voltage applied to an input terminal of the power grid;

an impedance calculator that calculates the power grid impedance using the voltage and current;

an impedance comparator comparing the power grid impedance with a set value to control the second switch to be turned on or off.

9. The LED tube according to claim 1 wherein the driving circuit comprises a strobe eliminating unit in series with the LED source.

10. The LED tube according to claim 1, wherein a period of time during which the supply voltage drops from the first set value to the second set value is 3-5 seconds, and another period of time that the current flowing through the LED light gradually changes from the first extreme value to the second extreme value is 5-10 seconds.

* * * * *